US008279670B2

(12) United States Patent  (10) Patent No.: US 8,279,670 B2
Futatsuyama et al.  (45) Date of Patent: Oct. 2, 2012

(54) NON-VOLATILE SEMICONDUCTOR STORAGE DEVICE

(75) Inventors: Takuya Futatsuyama, Yokohama (JP);
Yoshihisa Kondo, Fujisawa (JP);
Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 12/882,507

(22) Filed: Sep. 15, 2010

(65) Prior Publication Data

US 2011/0069545 A1 Mar. 24, 2011

(30) Foreign Application Priority Data

Sep. 18, 2009 (JP) ................................. 2009-217603

(51) Int. Cl.
*G11C 16/04* (2006.01)
(52) U.S. Cl. ............................. 365/185.03; 365/185.17
(58) Field of Classification Search ............. 365/185.03, 365/185.12, 185.17
See application file for complete search history.

(56) References Cited

U.S. PATENT DOCUMENTS

| | | | | |
|---|---|---|---|---|
| 6,937,510 | B2 * | 8/2005 | Hosono et al. ............ | 365/185.03 |
| 7,421,557 | B2 * | 9/2008 | Lee et al. ................. | 711/167 |
| 7,505,338 | B2 * | 3/2009 | Lee ............................. | 365/200 |
| 7,768,828 | B2 * | 8/2010 | Lee ......................... | 365/185.03 |
| 2009/0089491 | A1 | 4/2009 | Hatanaka et al. | |

FOREIGN PATENT DOCUMENTS

| | | |
|---|---|---|
| JP | 2008-146253 | 6/2008 |
| JP | 2009-3995 | 1/2009 |
| JP | 2009-86849 | 4/2009 |
| JP | 2009-104729 | 5/2009 |

OTHER PUBLICATIONS

U.S. Appl. No. 12/724,636, filed Mar. 16, 2010, Takayuka Futatsuyama.
Notification of Reason(s) for Refusal issued Aug. 7, 2012 in Japanese Patent Application No. 2009-217603 (with English translation).

* cited by examiner

*Primary Examiner* — Anh Phung
(74) *Attorney, Agent, or Firm* — Oblon, Spivak, McClelland, Maier & Neustadt, L.L.P.

(57) ABSTRACT

A non-volatile semiconductor storage device according to an embodiment includes: a memory cell array including an array of electrically rewritable memory cells and configured to be able to store N bits of data (where N is a natural number not less than 2) in one memory cell; and a controller operative to control read, write and erase operations of the memory cell array. The memory cell array includes a first region having a first memory cell operative to retain N bits of data, and a second region having a second memory cell operative to retain M bits of data (where M is a natural number less than N). A data structure of address data received by the controller when accessing the first memory cell is the same as a data structure of address data received from the outside when accessing the second memory cell.

20 Claims, 11 Drawing Sheets

| Input cycle | IO7 | IO6 | IO5 | IO4 | IO3 | IO2 | IO1 | IO0 |
|---|---|---|---|---|---|---|---|---|
| 1 | A7 | A6 | A5 | A4 | A3 | A2 | A1 | A0 |
|   | Column address ||||||||
| 2 | A15 | A14 | A13 | A12 | A11 | A10 | A9 | A8 |
|   | don't care | Column address |||||||
| 3 | A23 | A22 | A21 | A20 | A19 | A18 | A17 | A16 |
|   | don't care | WL |||||||
| 4 | A31 | A30 | A29 | A28 | A27 | A26 | A25 | A24 |
|   | Block ||||||| Plane |
| 5 | A39 | A38 | A37 | A36 | A35 | A34 | A33 | A32 |
|   | don't care | Chip ||| Block ||||

FIG. 11

| Input cycle | IO7 | IO6 | IO5 | IO4 | IO3 | IO2 | IO1 | IO0 |
|---|---|---|---|---|---|---|---|---|
| 1 | A7 | A6 | A5 | A4 | A3 | A2 | A1 | A0 |
|   | Column address ||||||||
| 2 | A15 | A14 | A13 | A12 | A11 | A10 | A9 | A8 |
|   | don't care || Column address ||||||
| 3 | A23 | A22 | A21 | A20 | A19 | A18 | A17 | A16 |
|   | don't care | WL |||||||
| 4 | A31 | A30 | A29 | A28 | A27 | A26 | A25 | A24 |
|   | Block ||||||| Plane |
| 5 | A39 | A38 | A37 | A36 | A35 | A34 | A33 | A32 |
|   | don't care | Chip ||| Block ||||

FIG. 12

| Input cycle | IO7 | IO6 | IO5 | IO4 | IO3 | IO2 | IO1 | IO0 |
|---|---|---|---|---|---|---|---|---|
| 1 | A7 | A6 | A5 | A4 | A3 | A2 | A1 | A0 |
|   | Column address ||||||||
| 2 | A15 | A14 | A13 | A12 | A11 | A10 | A9 | A8 |
|   | don't care || Column address ||||||
| 3 | A23 | A22 | A21 | A20 | A19 | A18 | A17 | A16 |
|   | WL |||||| bit(L/M/U) ||
| 4 | A31 | A30 | A29 | A28 | A27 | A26 | A25 | A24 |
|   | Block ||||||| Plane |
| 5 | A39 | A38 | A37 | A36 | A35 | A34 | A33 | A32 |
|   | don't care | Chip ||| Block ||||

NON-VOLATILE SEMICONDUCTOR STORAGE DEVICE

CROSS REFERENCE TO RELATED APPLICATIONS

This application is based on and claims the benefit of priority from prior Japanese Patent Application No. 2009-217603, filed on Sep. 18, 2009, the entire contents of which are incorporated herein by reference.

BACKGROUND

1. Field

Embodiments described herein relate generally to a non-volatile semiconductor storage device.

2. Description of the Related Art

Conventionally, electrically rewritable non-volatile semiconductor storage devices (EEPROM) are known. Among others, NAND cell type flash memory has been widely used since it allows for a high level of integration. The NAND cell type flash memory includes NAND cell units (memory strings), each having a plurality of memory cells connected in series so that source/drain diffusion layers are shared among adjacent cells. MOS transistors are used as memory cells of the NAND cell type flash memory. The MOS transistors include electric charge accumulation layers (floating gates) and control gates laminated and formed on a semiconductor substrate. The memory cells store data in a non-volatile manner depending on the amount of electric charges accumulated in the floating gates. There has also been proposed such NAND cell type flash memory that uses MONOS cells including electric charge accumulation layers of silicon nitride films or the like, instead of floating gates.

Each NAND cell unit has one end connected via a select gate transistor to a bit line, and the other end connected via a select gate transistor to a source line. The control gate of each memory cell is connected to a word line. A set of a plurality of memory cells formed along one word line forms one page (where 1 bit is stored per cell) or a plurality of pages (where multiple bits are stored per cell) on which a data write or read operation is performed simultaneously.

In addition, a plurality of NAND cell units aligned in the word-line direction are included in one block, which is usually a unit of collective data erase. Moreover, one plane includes a plurality of block arranged along the bit-line direction. Furthermore, for so-called multi-chip modules, multiple memory chips can be mounted on a single memory card.

In such NAND cell type flash memory, with recent advances in miniaturization and increasing demand for larger capacity, more and more memory chips are included in one module and the size of one page becomes larger and larger. Moreover, this leads to an increase in the number of memory cells connected in series in one NAND cell unit. Under these circumstances, there is an increase in the data volume of address data input at the time of reading and writing data.

Furthermore, if a multi-value storage scheme is adopted to store multiple bits of data (multiple pages of data) in one memory cell, then the address of the page in question must be specified.

Therefore, the data volume of address data tends to increase in association with an increase in memory capacity and adoption of multi-value storage schemes. As such, the larger the the data volume of address data becomes, the longer it will take to transfer the data. This may affect the operating speed of memory cells.

BRIEF DESCRIPTION OF THE DRAWINGS

FIG. 11 illustrates a data structure of an address data map used in this embodiment;

FIG. 12 illustrates a data structure of an address data map according to a comparative example;

DETAILED DESCRIPTION

A non-volatile semiconductor storage device according to the embodiments comprises: a memory cell array including an array of electrically rewritable memory cells and configured to be able to store N bits of data (where N is a natural number not less than 2) in one memory cell; and a controller operative to control read, write and erase operations of the memory cell array.

The memory cell array includes a first region having a first memory cell operative to retain N bits of data, and a second region having a second memory cell operative to retain M bits of data (where M is a natural number less than N). A data structure of address data received by the controller when accessing the first memory cell is the same as a data structure of address data received from the outside when accessing the second memory cell.

A non-volatile semiconductor storage device according to another aspect of the embodiments comprises: a memory cell array including an array of electrically rewritable memory cells and configured to be able to store N bits of data (where N is a natural number not less than 2) in one memory cell; and a controller operative to control read, write and erase operations of the memory cell array. The memory cell array includes a first region having a first memory cell operative to retain N bits of data, and a second region having a second memory cell operative to retain M bits of data (where M is a natural number less than N). The controller is operative to be supplied with: information identifying positions of the memory cells as address data; and data specifying any of N pages of data, the data being included as a part of a command.

The embodiments include a method of writing to a non-volatile semiconductor storage device. The non-volatile semiconductor storage device for which the method of writing is performed comprises a memory cell array including an array of electrically rewritable memory cells and configured to be able to store N bits of data (where N is a natural number not less than 2) in one memory cell. The memory cell array includes a first region having a first memory cell operative to retain N bits of data, and a second region having a second memory cell operative to retain M bits of data (where M is a natural number less than N). The method of writing comprises: supplying information identifying positions of the memory cells to the non-volatile semiconductor storage device as address data; and supplying data specifying any of N pages of data to the non-volatile semiconductor storage device, the data being included as a part of a command.

The embodiments of the present invention will now be described in detail below with reference to the accompanying drawings.

Figure 1A:
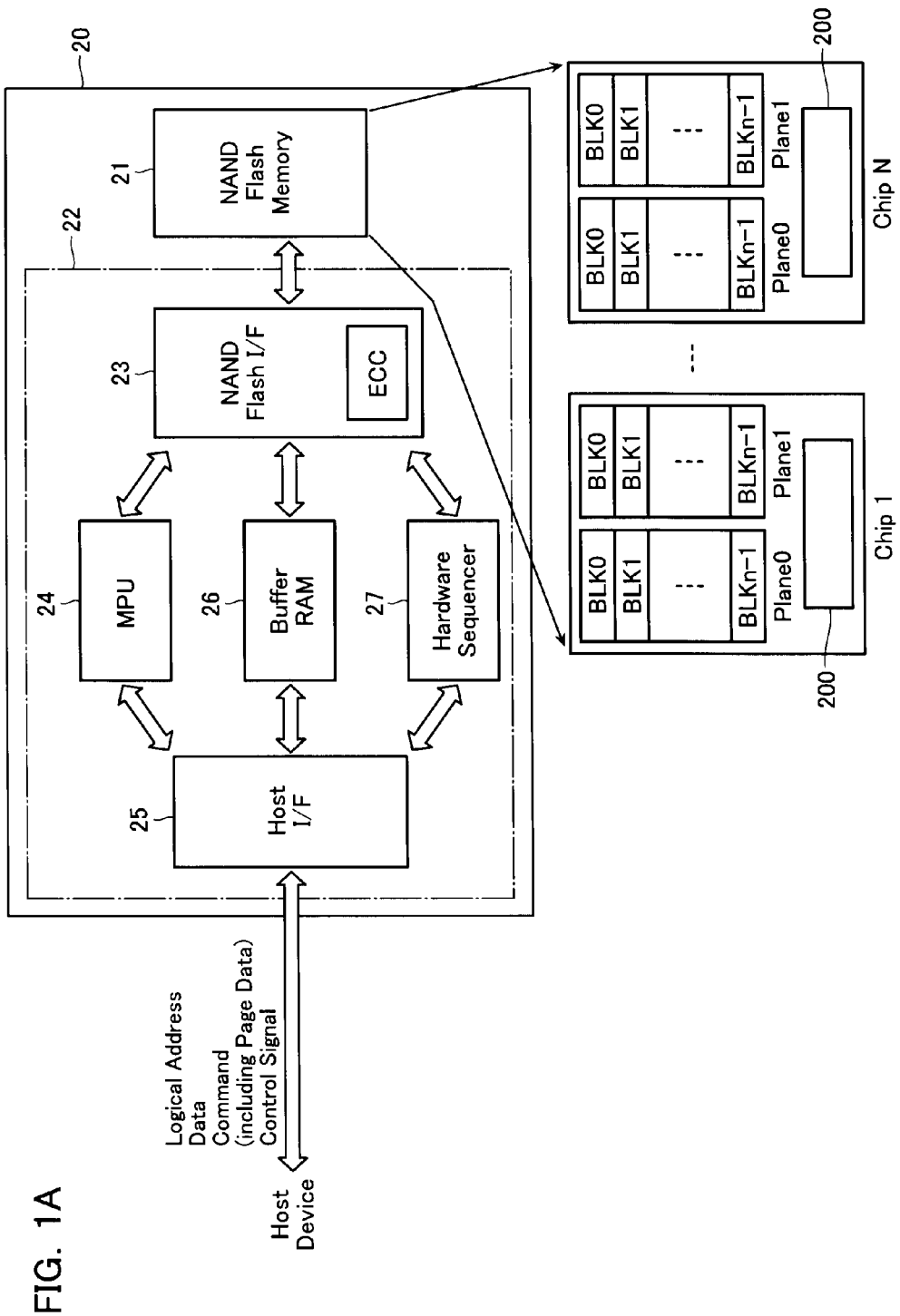
FIG. 1A is a block diagram illustrating a non-volatile semiconductor storage device according to an embodiment.

Referring to FIG. 1A, a non-volatile semiconductor storage device according to embodiments of the present invention will be described below.

[Configuration of Non-Volatile Semiconductor Storage Device]

FIG. 1A is a block diagram illustrating the non-volatile semiconductor storage device according to this embodiment. The non-volatile semiconductor storage device of this embodiment includes a memory module 20 in which, for example, NAND flash memory 21 including one or more memory chips and a memory controller operative to control read/write/erase operations thereof are integrally packaged. Since all of the mounted flash memory 21 is controlled as logical memory by a single memory controller 22, this module 20 will be referred to as Logic Block Address NAND flash memory 20 (hereinafter, abbreviated as LBA-NAND™ memory 20).

The NAND flash memory 21 mounted on the LBA-NAND™ memory 20 comprises a plurality of (N) memory chips Chip1, . . . , ChipN, which in turn are controlled by a single memory controller 22.

A plurality of (in this case, 2) planes Plane0 and Plane1 are formed in one chip Chip. One plane is a unit of a group of memory sharing a row decoder, a column decoder, and so on. A plurality of blocks BLK (in this case, n blocks BLK0 to BLKn−1) are formed in the one plane. Each block BLK represents a unit of data erase. Each chip Chip comprises a respective control circuit 200.

The memory controller 22 is a one-chip controller that has a NAND flash interface 23 for transferring data to and from the flash memory 21, a host interface 25 for transferring data to and from a host device, buffer RAM 26 for temporarily retaining data such as read/write data, MPU 24 for controlling data transfer, and a hardware sequencer 27 for use in, e.g., sequence control of read/write/erase in the NAND flash memory 21.

Figure 1B:
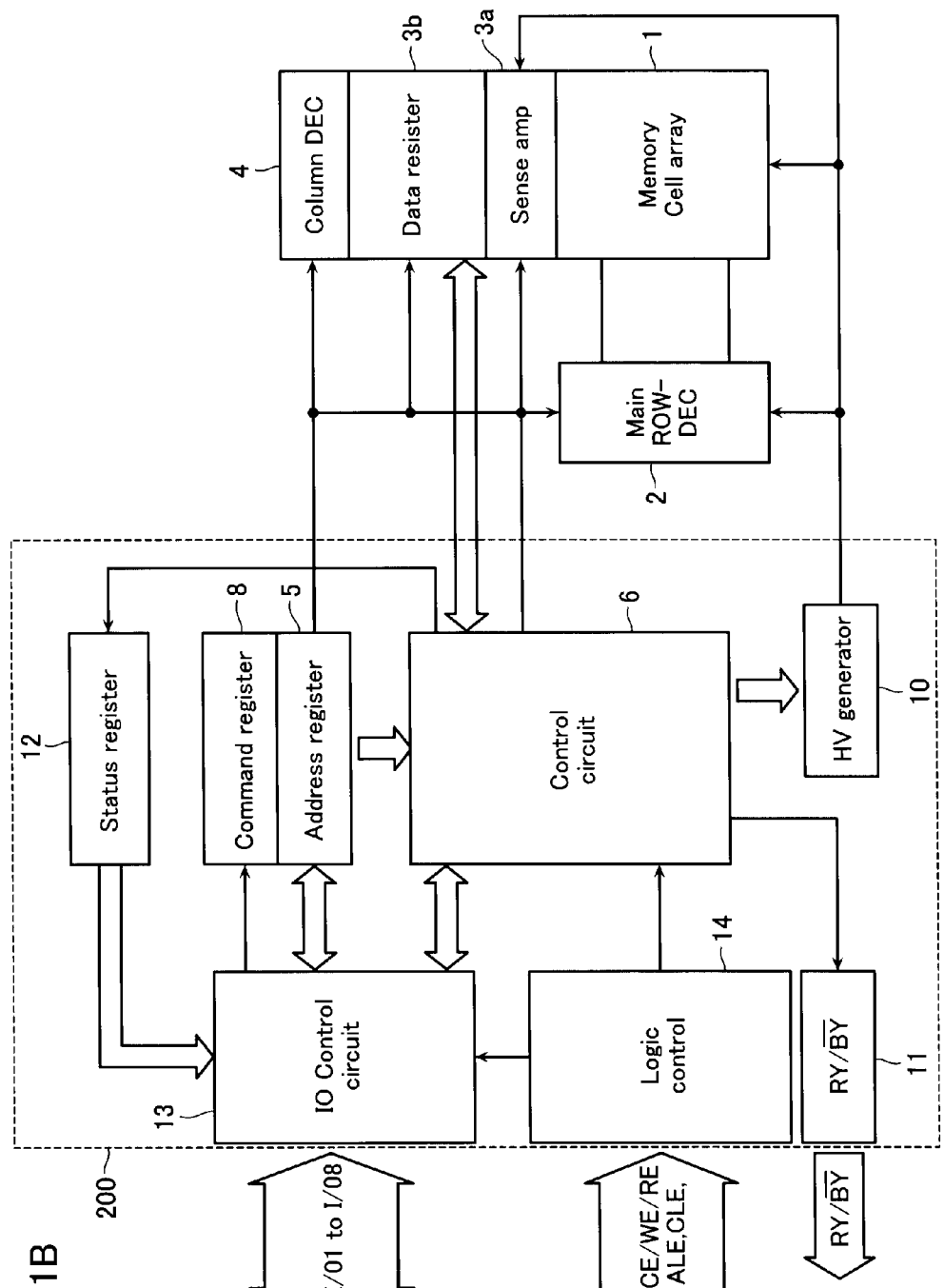
FIG. 1B is a block diagram illustrating an example of a specific configuration of each chip Chip as illustrated in FIG. 1A.

FIG. 1B is a block diagram illustrating an example of a specific configuration of each chip Chip (Chip1 to ChipN) as illustrated in FIG. 1A.

As illustrated in FIG. 1B, a control circuit 200 comprises an address register 5, a control circuit 6, a command register 8, a high-voltage generation circuit 10, status registers 11 and 12, an input control circuit 13, and a logic control circuit 14.

Commands, addresses and data are input from the memory controller 22 via the input control circuit 13. Chip enable signals/CE, write enable signals/WE, read enable signals/RE, and other external control signals are input from the memory controller 22 to the logic control circuit 14 for use in timing control. The commands are temporarily retained in the command register 8.

The control circuit 6 provides control of data transfer and sequence control of read/write/erase. The status register 11 outputs Ready/Busy states of the LBA-NAND memory™ 20 to a Ready/Busy terminal. In addition to this, the status register 12 is also provided to inform a host of states of the memory 20 (such as Pass/Fail or Ready/Busy) via an I/O port.

Addresses are temporarily retained in the address register 5 and then transferred to the row decoder 2 or the column decoder 4. Write data are loaded through an input control circuit 7 and the control circuit 6 into a sense amplifier circuit 3 (sense amplifiers 3a and data registers 3b), while read data are output through the control circuit 6 and the input control circuit 7 to the outside.

The high-voltage generation circuit 10 is provided for generating a high voltage required for each mode of operation. The high-voltage generation circuit 10 generates a certain high voltage based on an order from the control circuit 6.

Figure 2:
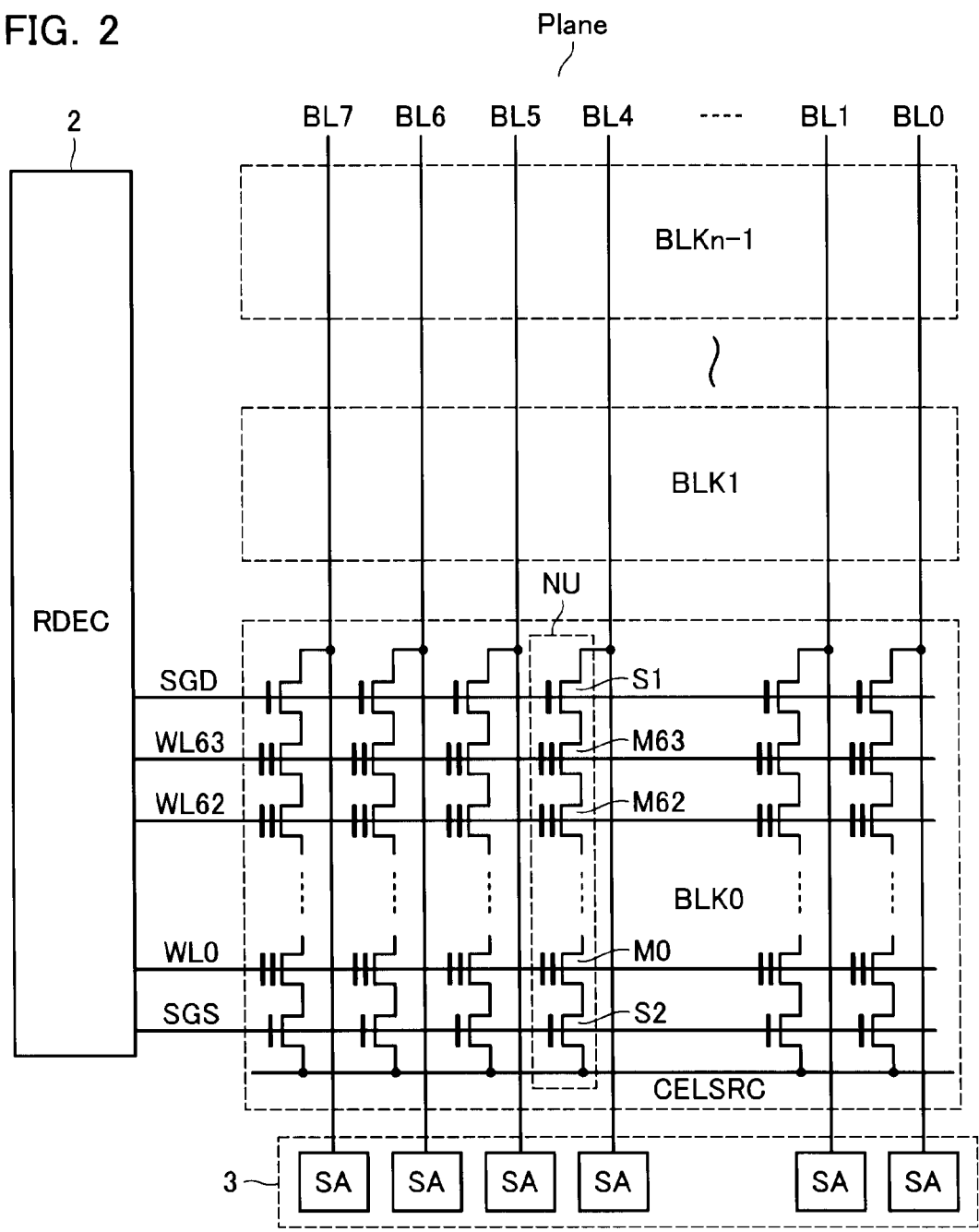
FIG. 2 illustrates a cell array configuration within one plane Plane of the NAND flash memory 21 of FIG. 1.

FIG. 2 illustrates a cell array configuration within one plane Plane of the NAND flash memory 21 of FIG. 1.

A memory cell array 1 includes an array of NAND cell units (memory strings) NU, each having a plurality of electrically rewritable non-volatile memory cells M0-M63 connected in series (in this illustrative example, 64 memory cells).

The NAND cell units NU each have one end connected via a select gate transistor S1 to a bit line BL, and the other end connected via a select gate transistor S2 to a common source line CELSRC. The control gates of the memory cells M0-M63 are connected to respective word lines WL0-WL63. The gates of the select gate transistors S1 and S2 are connected to select gate lines SGD and SGS.

A set of NAND cell units arranged along the word-line direction is included in a memory block, which represents a minimum unit of data erase. As illustrated, a plurality of memory blocks BLK0-BLKn−1 are arranged along the bit-line direction.

A sense amplifier circuit 3 is positioned at one end of each bit line BL. The sense amplifier circuit 3 is used to read, write and erase cell data. A row decoder 2 is positioned at one end of each word line WL. The row decoder 2 selectively drives a word line and a select gate line. FIG. 2 illustrates a configuration when such a scheme is employed that involves reading all bit lines simultaneously (ABL scheme), while suppressing the effects of parasitic capacitance by means of, e.g., current detection type sense amplifiers. In this case, a sense amplifier SA is provided for each bit line BL.

Note that such a configuration is also known that even-numbered bit lines BLe and odd-numbered bit lines BLo adjacent to each other are selectively connected by a bit-line selection circuit to respective sense amplifiers SA of the sense amplifier circuit 3. In this case, for example, if an even-numbered bit line BLe is selected, then an unselected odd-numbered bit line BLo may act as a shield line and thereby reduce the effects of parasitic capacitance of the selected bit line BLe (a bit-line shield scheme). Of course, the present invention is also applicable to a cell array employing such a bit-line shield scheme.

In addition, the memory cells adjacent to the select gate lines SGD and SGS may be dummy cells that are not used for data storage. Although the following description will primarily be made on the assumption that there are no such dummy cells, the present invention is also applicable to other memory cell arrays in which dummy cells are provided.

In addition, while the above embodiment has been described for the case where 64 ($2^6$) memory cells MC are connected in series within one NAND cell unit, the present invention is of course not so limited. Generally, one NAND cell unit includes a power-of-two number of memory cells.

However, if bits of data which is not power-of-two bits (e.g., 3 bits) is stored in one memory cell, the number of memory cells in one NAND cell unit is preferably set to a number other than a power of two so that the number of bits (storage capacity) per block is a power of two. For example, if 3 bits are stored per memory cell (3 bits/cell), then 86 memory cells MC are provided in one NAND cell unit. Then, a 1 bit/cell storage scheme is applied to only one of the 86 memory cells MC, and a 3 bits/cell storage scheme is applied to the remaining 85 memory cells. This results in a capacity of a power-of-two number of bits per block (the storage capacity per NAND cell unit is 1+85×3=256 bits). That is, the number of memory cells in each NAND cell unit as well as the number of those memory cells in the NAND cell unit on which an N bits/cell storage scheme is implemented are determined so that a power-of-two number of bits of data are capable of being stored in one block.

In the LBA-NAND™ memory 20 configured as described above, commands, addresses (logical addresses) and data, as well as external control signals, such as chip enable signals/CE, write enable signals/WE, read enable signals/RE, or ready/busy signals RY/BY, are input to the host I/F 25. The host I/F 25 distributes commands and control signals to the MPU 24 and the hardware sequencer 27, and transfers addresses and data to the MPU 24 and the buffer RAM 26, respectively.

Logical address data input from the outside are converted to the physical address data of the NAND flash memory 21 at the NAND flash I/F 23. In addition, under the control of the hardware sequencer 27 based on various control signals, control of data transfer and sequence control of read/write/erase are performed. The converted physical address data are transferred through the address register in the NAND flash memory 21 to the row decoder 2 and a column decoder (not illustrated). Write data are loaded through an I/O control circuit into the sense amplifier circuit 3, while read data are output through the I/O control circuit to the outside.

Meanwhile, a logical address includes: a chip address that identifies any one of a plurality of chips; a plane address that identifies a plane in one chip; a block address that identifies one of a plurality of blocks in one plane; a row address that identifies one word line in one block; and a column address that identifies one column in one word line. Additionally, when accessing memory employing an N bits/cell (N≧2) storage scheme, it is also required to specify the page data that identify a page (for 3 bits/cell, any of upper page Upper, middle page Middle, and lower page Lower).

However, in this embodiment, such page data to identify one page are included in a command, rather than in logical address data. This may offer various advantages, such as improved access speed. This will be described in detail below. In the following description, the term "page data" refers to such data that identify which of the pages is specified when an N bits/cell storage scheme is employed.

[Memory Region]

FIG. 3 illustrates details of the memory region of the LBA-NAND™ memory according to this embodiment. The LBA-NAND™ memory 20 of this embodiment has a plurality of data regions (logical block access regions). Access to these data regions can be switched from one to another according to a command. Specifically, this embodiment has two or three data storage regions that are partitioned depending on their use and data reliability.

Figure 3A:
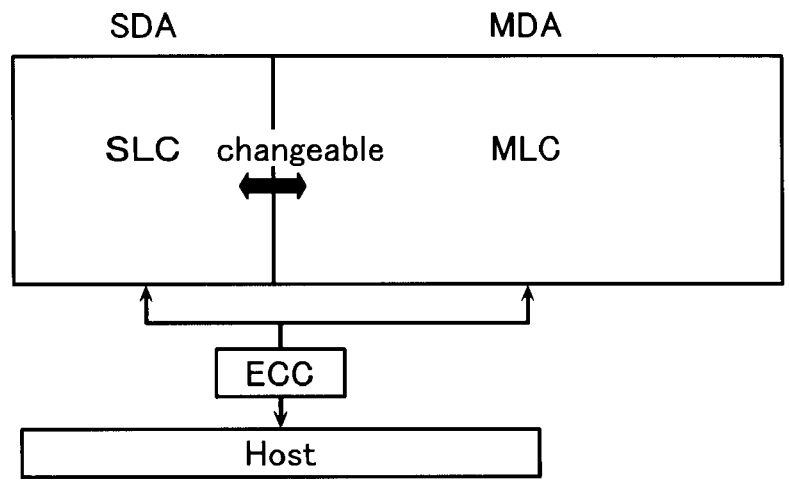
FIGS. 3A and 3B each illustrate details of the memory region of the LBA-NAND™ memory according to this embodiment.
Figure 3B:
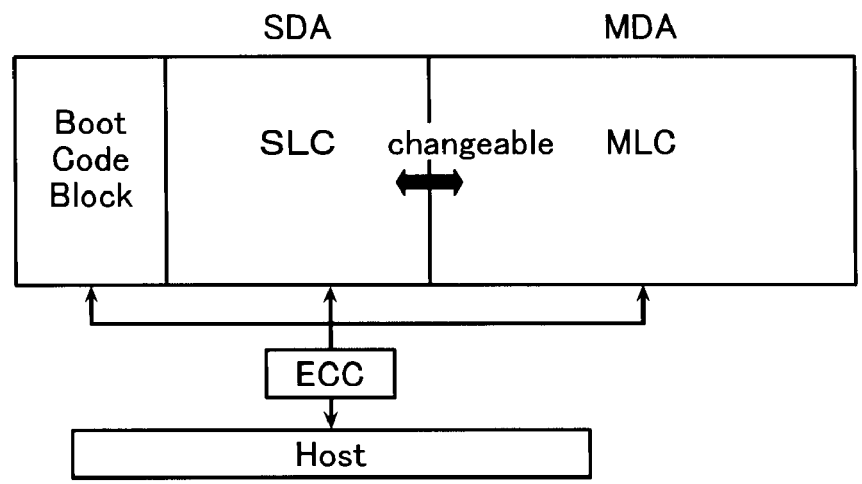

In a standard operation mode as illustrated in FIG. 3A, there are two data storage regions, each of which stores information having a different property. One is a binary data storage region SDA (SLC Data Area) with SLC (Single Level Cell), and another is a multi-value data storage region MDA (MLC Data Area) with MLC (Multi Level Cell). The binary data storage region SDA is suitable for storing initial setting data, log data of file systems or network communications, and so on, while the multi-value data storage region MDA is suitable for storing music, images, applications, and the like. In an optional power-on mode as illustrated in FIG. 3B, a boot code block to store boot code is provided at the head of the memory region in addition to the data storage regions SDA and MDA. In these two modes, a boundary between the binary data storage region SDA and the multi-value data storage region MDA can be changed arbitrarily according to an order of a command.

[Operation]

Referring now to FIGS. 4 to 17, an operation of this embodiment will be described below.

The non-volatile semiconductor storage device of this embodiment provides a storage region to store N bits per memory cell in a part of a memory cell array at least. There are many ways of this write procedure of N bits of data, which will be described in due order.

Figure 4:
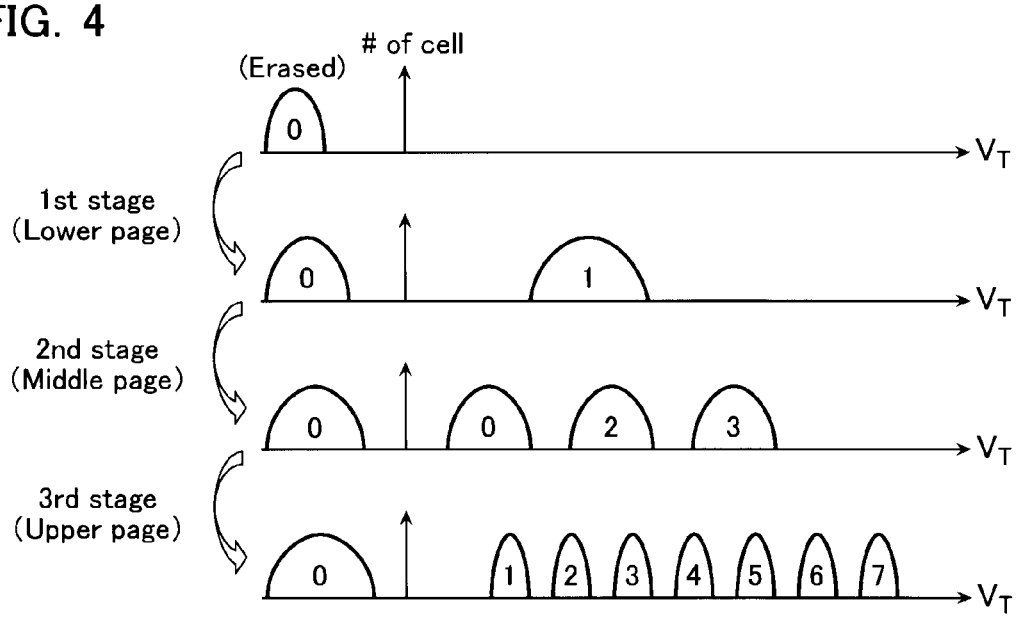
FIG. 4 illustrates an example of a data write procedure when a 3 bits/cell storage scheme is implemented.

FIG. 4 illustrates an example of a data write procedure when a 3 bits/cell storage scheme is applied. In this method, firstly, lower page data Lower corresponding to the lowest bit of 3 bits of data is provided, and two threshold voltage distributions 0 and 1 are formed based on this lower page data Lower (1st stage). Then, middle page data Middle corresponding to the middle bit of the 3 bits of data is provided, and these two threshold voltage distributions 0 and 1 are each subdivided into another two threshold voltage distributions based on the middle page data Middle, whereby four threshold voltage distributions 0 to 3 are formed (2nd stage). Finally, upper page data Upper corresponding to the upper bit of the 3 bits of data is provided, and eight threshold voltage distributions 0 to 7 are formed based on this upper page data Upper (3rd stage).

This procedure of FIG. 4 is a step-by-step scheme that writes N bits of data in N stages (in the case of FIG. 4, N=3). Additionally, the scheme of FIG. 4 involves a "fine write scheme" that performs write operations so that the threshold voltage distributions will not overlap each other throughout the 1st to 3rd stages. On the other hand, there is another scheme that first performs a coarse (rough) write operation such that the threshold voltage distributions will involve some overlap portions with each other, and then performs a fine write operation without overlaps. This scheme is referred to hereinafter as a "rough/fine write scheme".

Figure 5:
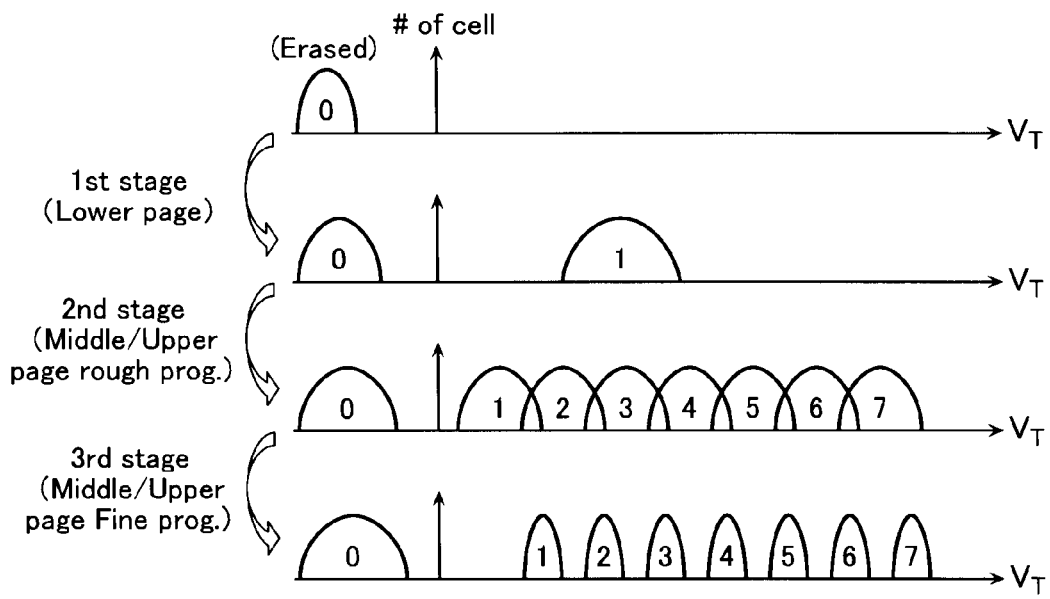
FIG. 5 illustrates an example of a data write procedure when a 3 bits/cell storage scheme is implemented.

Similar to FIG. 4, FIG. 5 illustrates a write procedure when a 3 bits/cell storage scheme is applied. The write operation of lower page Lower in the 1st stage is similar to that described in FIG. 4. However, the procedure of FIG. 5 is different from that of FIG. 4 in that all of lower page Lower, middle page data Middle and upper page data Upper are provided at a time and threshold voltage distributions 0 to 7 are obtained in the 2nd stage. However, the write operation in the 2nd stage is a coarse (rough) write (rough write) operation such that the threshold voltage distributions 0 to 7 will involve some overlap portions with each other. Then, in the 3rd stage, all of the lower page Lower, the middle page data Middle and the upper page data Upper are provided again, and a write operation is performed so that the threshold voltage distributions 0 to 7 will have a proper margin in between without overlaps (fine write). That is, FIG. 5 illustrates a write procedure when the "rough/fine write scheme" is employed in a 3 bits/cell storage scheme.

Figure 6:
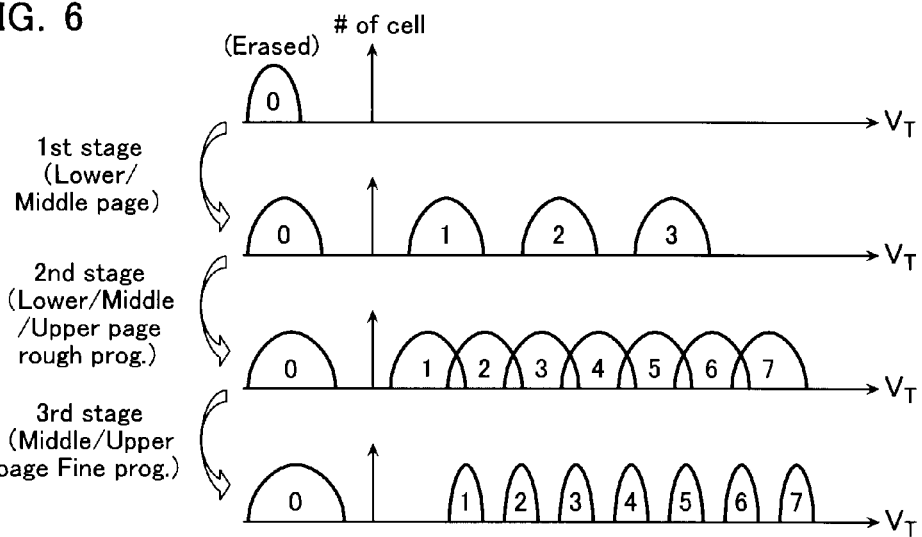
FIG. 6 illustrates an example of a data write procedure when a 3 bits/cell storage scheme is implemented.

Similar to FIG. 5, FIG. 6 illustrates a write procedure when the "rough/fine write scheme" is employed in a 3 bits/cell storage scheme. This case is, however, different from that of FIG. 5 in that a fine write operation is performed in the 1st stage during which lower page data Lower and middle page data Middle are provided and four threshold voltage distributions 0 to 4 are obtained at a time, and then all of the page data Lower, Middle, and Upper are provided and a rough/fine write operation is performed in the 2nd and 3rd stages.

Figure 7:
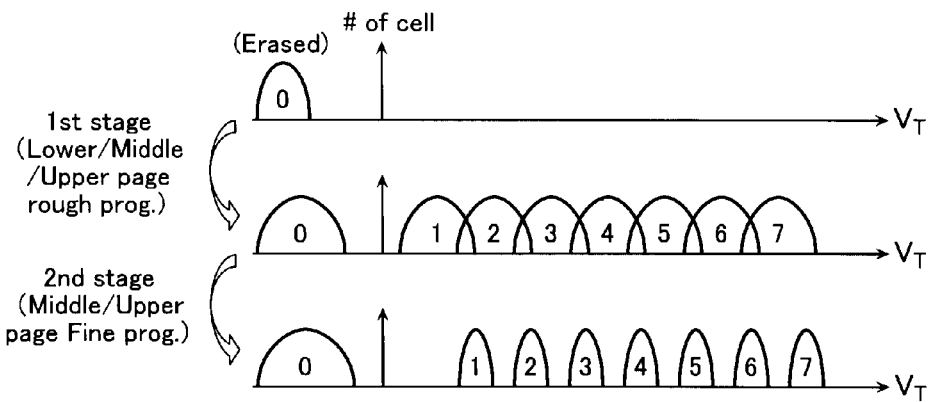
FIG. 7 illustrates an example of a data write procedure when a 3 bits/cell storage scheme is implemented.

FIG. 7 illustrates a method in which in the 1st stage all of the page data Lower, Middle, and Upper are provided and a rough write operation is performed, and in the subsequent 2nd stage all of the page data Lower, Middle, and Upper are provided again and a fine write operation is performed.

Figure 8:
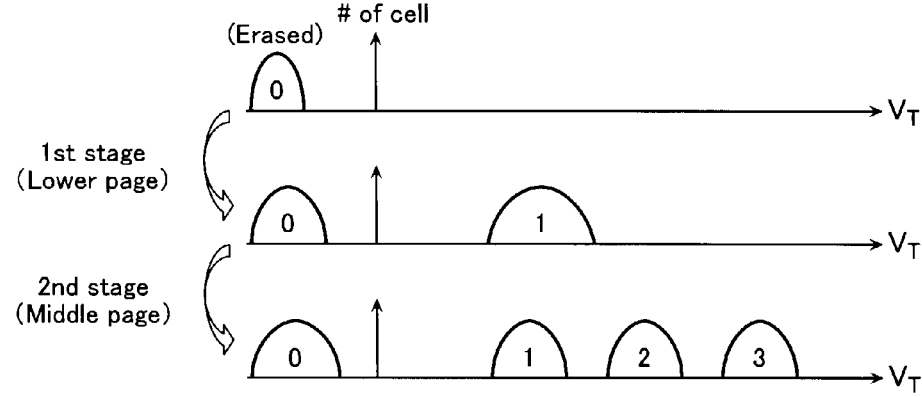
FIG. 8 illustrates an example of a data write procedure when a 2 bits/cell storage scheme is implemented.
Figures 9, 10:
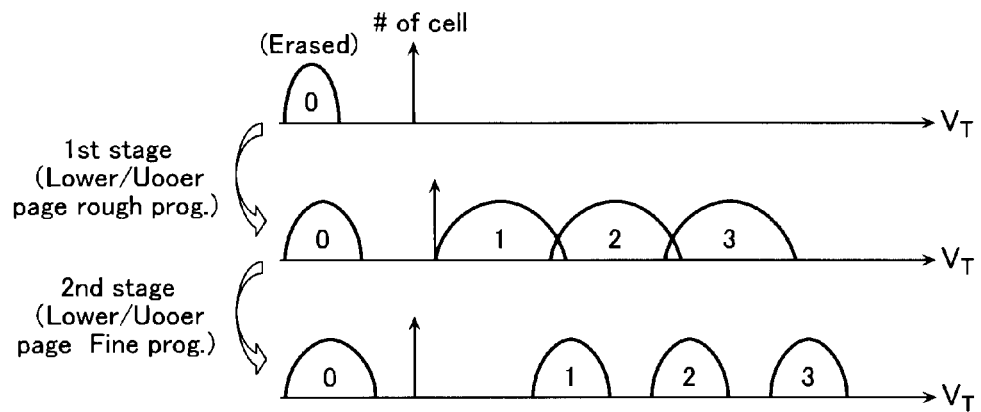
FIG. 9 illustrates an example of a data write procedure when a 2 bits/cell storage scheme is implemented.
FIG. 10 illustrates a data structure of an address data map used in this embodiment.

FIGS. 8 and 9 each illustrate a write procedure when a 2 bits/cell storage scheme is implemented. FIG. 8 illustrates a write procedure employing the fine write scheme of the step-by-step scheme; and FIG. 9 illustrates a write procedure employing the rough/fine scheme.

As described above, many different write schemes are also applicable when the 3 bits/cell storage scheme is adopted. In this case, respective page data are provided at different timings for the different write schemes. For example, all of the page data are provided at a time with the scheme of FIG. 7, while the respective page data are provided one at a time with the scheme of FIG. 4.

Furthermore, for example, if the scheme of FIG. 4 is fixedly employed, one storage region for writing 1 bit/cell and another for writing 3 bits/cell exist in one memory chip. These regions have different address data to provide. For the storage region for writing 1 bit/cell, it is only necessary to identify a physical address of a memory cell (a column) on which write/read operations are performed, ant there is no need for page data (Lower, Middle, Upper). In contrast, the storage region for writing 3 bits/cell requires the above-mentioned page data in addition to identification of the physical address.

Here, assuming that the structure of address data is fitted to the latter case, this may lead to generation of superfluous portions of the data structure in the former case. This may result in an unnecessarily increase in the number of bits of address data. Thus, it can take longer to process the address data, decreasing the data reading speed.

In view of these problems, this embodiment receives address data having a data structure as described below to perform data write/read operations.

FIGS. 10 and 11 each illustrate a data structure of an address data map provided from the outside according to this embodiment. FIG. 10 illustrates a data structure of an address data map when 64 memory cells MC are present in one memory string MS and 2 bits/cell write operations are performed on some regions of the memory cell array. On the other hand, FIG. 11 illustrates a data structure of address data when 86 memory cells MC are present in one memory string MS and 3 bits/cell write operations are performed on some regions of the memory cell array. The configuration of FIG. 11 is substantially the same as that of FIG. 10, except the difference in the number of bits of address data for identifying a word line WL. Therefore, only the data structure of FIG. 10 will be described below. It should be noted that the assignment of address data as described in this example is merely an example, and that where to position "don't care" and how to assign address data including Column address, WL, Block, Chip, and Plane are arbitrary.

As illustrated in FIG. 10, an address that identifies the position of a memory cell to be read is input in units of 8 bits from respective I/O terminals IO0 to IO7 of 8 bits (1 Byte) in several cycles. In this case, five kinds of addresses are sequentially input over five input cycles 1 to 5: column address (Column Address), word line WL address (WL), block address (Block), plane address (Plane), and chip address (Chip). Note that "Don't care" in FIG. 10 each represents an excess region in the address data map, which is ignored by the MPU 24. It should be understood that FIGS. 10 and 11 illustrate merely an example of a data structure of address data in the memory device as illustrated in FIG. 1. In addition, memory devices having different structures may adopt different address data structures, and all such different address structures may of course fall within the scope of the present invention. For example, if there is only one memory chip, then the chip address is unnecessary, while if one chip has only one plane, the the plane address is unnecessary. Other different data may also be included in the address data map based on differences in the structure of memory cell array, reading scheme, and so on.

As can be seen from FIG. 10, this address data does not include any page data that indicates which of multiple pages (i.e., Upper or Middle or Lower) is subject to a write operation or a read operation when an N bits/cell storage scheme is implemented. Such page data are included in a command and supplied to the memory controller 22, which will be discussed later.

In this way, page data is included in a command rather than in address data when an N bits/cell storage scheme is implemented. This may not induce any expansion of address data even if the N bits/cell storage scheme is employed, and so can prevent it taking longer to process the address data.

In addition, as mentioned earlier, a 1 bit/cell storage scheme is often applied to some regions of a memory cell array even when an N bits/cell storage scheme is employed (see FIG. 4). In such a case, if page data is included in the address data map as in a comparative example illustrated in FIG. 12 (see bit (L/M/U) in FIG. 12), then the structure of address data must be conform to the case where N bits/cell write operations and so on are performed. That is, when performing write and read operations in the latter case, the storage region of page data (bit (L/M/U)) would become "Don't Care" as mentioned above, and address data would have different structures for N bits/cell write and 1 bit/cell write operations. This could prolong the entire process of address data, and thus decrease the reading speed.

In this regard, with the address data structure of this embodiment, since address data does not include page data, there will be no unnecessary regions in the address data map even if a 1 bit/cell storage scheme coexists with an N bits/cell storage scheme. In other words, it is possible to utilize a common data structure to both the address data maps with the 1 bit/cell storage scheme and the N bits/cell storage scheme. This may simplify the operation as well as circuits for processing addresses, reducing the number of circuit elements.

Advantages of this embodiment will be specifically demonstrated as follows. Firstly, the number of memory cells used for data storage in one memory string (hereinafter, referred to as "effective memory cells") is defined as C (given by the total number of memory cells in one memory string minus the number of dummy cells not used for data storage). It is also assumed that an n bits/cell storage scheme (where n is a natural number which is a power of two) is employed by at least some of the effective memory cells. Moreover, let Pw be the number of bits of a word-line address to specify a word line connected to effective memory cells, and let Pp be the number of bits of page data. Furthermore, let P (=Pw+Pp) be the total number of bits of both.

In this case, if page data are included in address data as in the comparative example, then C, n, and P are set so that they satisfy:

$$2^P = 2^{(Pw+Pp)} = C \times n. \quad \text{[Formula 1]}$$

Therefore, as C and n increase, Pw and Pp increase correspondingly. This induces an expansion of data volume of the address data map. In addition, if a 1 bit/cell storage scheme is employed at some part, an excess region equal to $2^{Pp}$ bits should be provided in the address data map. As a result, the address data map becomes unnecessarily large.

In contrast, according to this embodiment, although the data volume of the address map data increase naturally as C increases, the data volume of the address data map does not increase as n increases. That is, Pw only needs to be set to satisfy the following formula. This suppresses an increase in the data volume of the address data map.

$$2^{Pw} = C \quad \text{[Formula 2]}$$

Note that if n' bits which is not power-of-two bits, of data is stored in one memory cell (n' bits/cell), the number of effective memory cells C in one memory string is set to a number which is not a power of two, as mentioned earlier. In this case, a relation between the number of bits of a word-line address Pw and C is set to satisfy the following relation. Again, the data volume of the address data map does not increase as n' increases.

$$2^{(Pw-1)} < C \leq 2^{Pw} \quad \text{[Formula 3]}$$

To summarize, when an N bits/cell (where N is a natural number not less than 2) storage scheme is implemented, the address data map only needs to be configured so that the relation given by [Formula 3] is satisfied (i.e., irrespective of the magnitude of N).

FIGS. 13 to 18 each illustrate examples of commands provided in this embodiment. In this embodiment, page data is included in a command as described above, and write operations/read operations are performed based on the content of the command according to an N bits/cell storage scheme.

Figure 13:
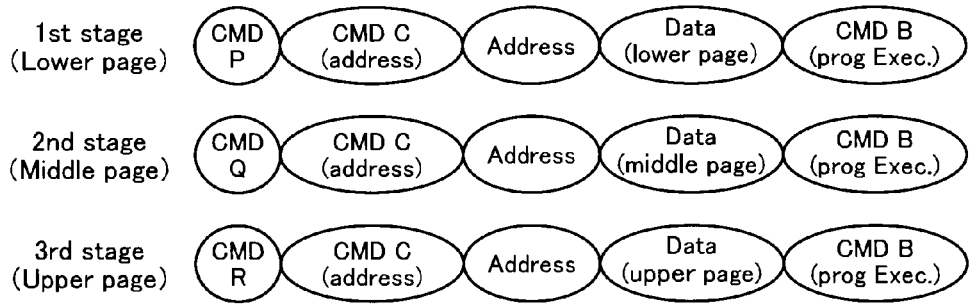
FIG. 13 illustrates examples of commands used in this embodiment.

FIG. 13 illustrate examples of commands when the write procedure of FIG. 4 is employed. In this case, commands are input in three stages of the 1st to 3rd stages. Commands P, Q, and R are received at the beginning of respective stages. Command P is a command to order write of lower page data Lower. Command Q is a command to order write of middle page data Middle. Command R is a command to order write of upper page data Upper. In addition, the subsequent Command C is a command to order input of an address. Then, the address data map (Address) and the write data (Data) of FIG. 10 are input sequentially. Finally, Command B is input to order initiation of a write operation. These Commands P, Q, and R are intended to identify page data instead of the page data (bit (L/M/U)) in the address data map of FIG. 12. Accordingly, transmission of these commands allows the address data map to be provided with the same structure, regardless of whether an N bits/cell write operation or a 1 bit/cell write operation is performed.

Figure 14:
FIG. 14 illustrates examples of commands used in this embodiment.

FIG. 14 illustrates examples of commands when the write procedure of FIG. 5 is employed. Again, commands are also input in three stages of the 1st to 3rd stages. However, in addition to Commands P, Q, and R, Commands X1, X2, and X3 are also input at the beginning of respective stages. Command X1 is a command to order execution of 1st stage write in the write procedure of the 3 bits/cell storage scheme. Command X2 is a command to order execution of 2nd stage write (rough write). Command X3 is a command to order execution of 3rd stage write (fine write). In the 1st stage write, subsequent to Command X1, Command P is input to write lower page data. Then, similar to those illustrated in FIG. 13, Command C ordering input of an address, address data, and write data are input sequentially. Finally, Command B is input to order initiation of a write operation. Since the 2nd stage write requires input of 3 bits of write data, Address and Data are input three times. Commands X2, P, C, and Address are input, followed by lower page data, and then Command A indicating that the input of write data continues. Subsequently, Commands X2, Q, C, and Address are input, followed by middle page data, and then Command A indicating that the input of write data continues. Finally, Commands X2, R, C, and Address are input, followed by upper page data, and then Command B ordering a write operation to begin. The 3rd stage write operation is performed differently from the 2nd stage in that Command X2 is replaced by Command X3. Meanwhile, since the 3rd stage corresponds to a fine write operation, it may be carried out without Command X3. In this case, Commands X1, X2, and X3 function as commands for specifying a write scheme, while Commands P, Q, and R function as commands for specifying any of N pages of data, respectively, and thus act as alternatives to the page data of FIG. 12. Although not illustrated, a latency of on the order of 15 μs, for example, is set after the execution of each Command A.

Figure 15:
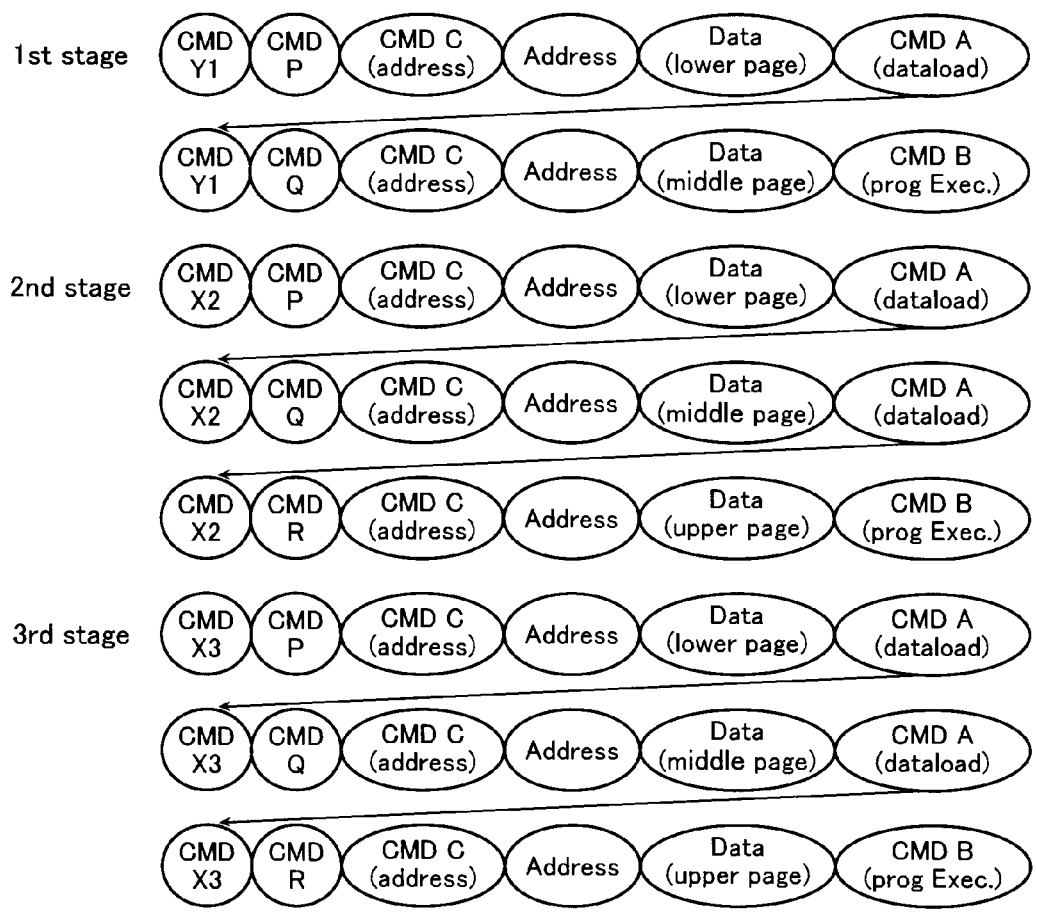
FIG. 15 illustrates examples of commands used in this embodiment.

FIG. 15 illustrates examples of commands when the write procedure of FIG. 6 is employed. The difference from the command input scheme illustrated in FIG. 14 is that the 1st stage write is performed with 2 bits of write data. Since 2 bits of write data needs to be input, Address and Data are input two times. Commands Y1, P, C, and Address are input, followed by lower page data, and then Command A indicating that the input of write data continues. Subsequently, Commands Y1, Q, C, and Address are input, followed by middle page data, and then Command B ordering a write operation to begin. In this case, Command Y1 is a command to order execution of 1st stage write by 2 bits/cell, and is thus distinguished from Command X1 ordering execution of 1st stage write by 3 bits/cell.

Figure 16:
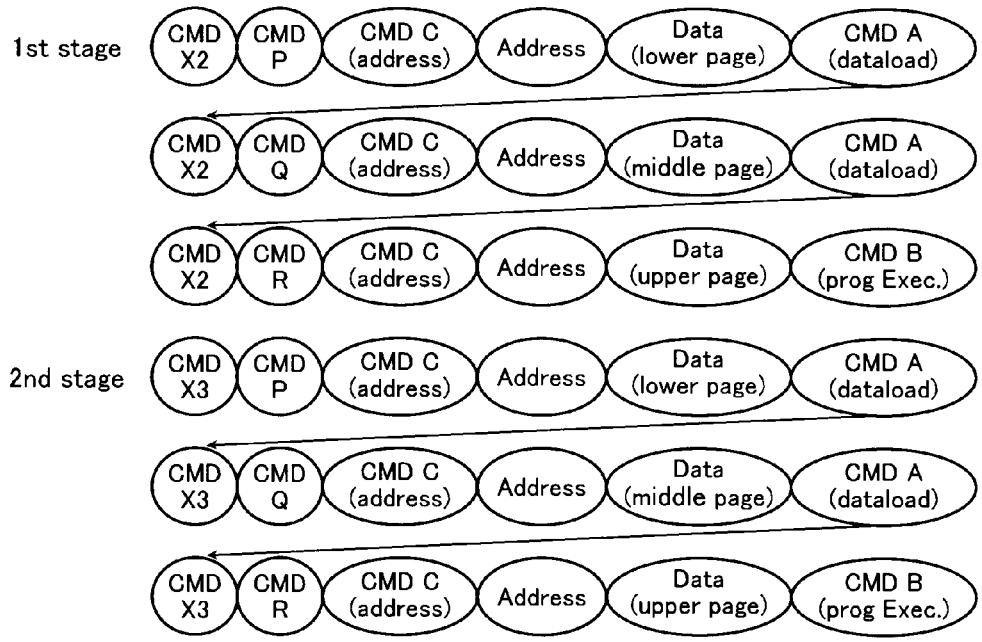
FIG. 16 illustrates examples of commands used in this embodiment.

FIG. 16 illustrates examples of commands when the write procedure of FIG. 7 is employed. In this case, commands are input in two stages of the 1st and 2nd stages. The operation of the 1st stage is similar to that of "2nd stage" in FIG. 14. In the 2nd stage of FIG. 16, a fine write operation of the eight threshold voltage distributions 0-7 is performed.

Figure 17:
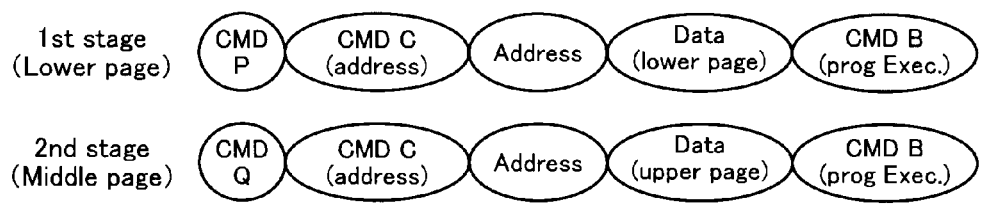
FIG. 17 illustrates examples of commands used in this embodiment.
Figure 18:
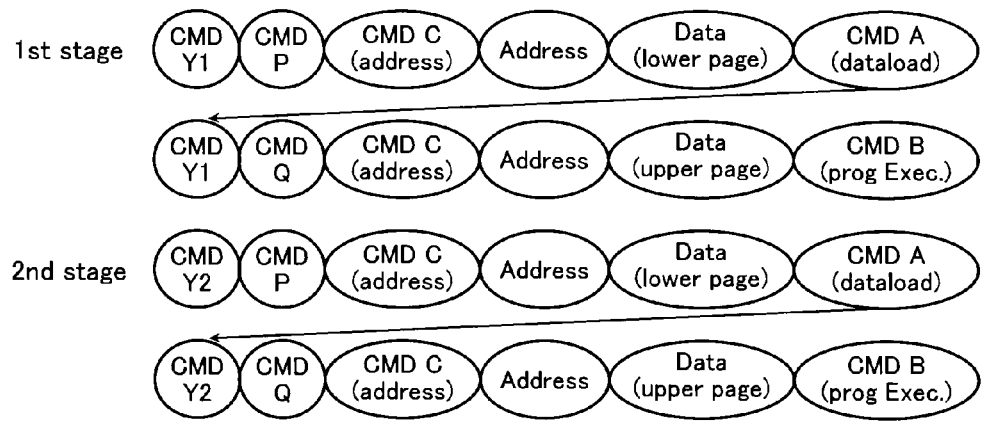
FIG. 18 illustrates examples of commands used in this embodiment.

FIGS. 17 and 18 illustrate examples of commands when the write operations of FIGS. 8 and 9 are employed, respectively. There are fewer input stages of commands for the 2 bits/cell write scheme. However, in the 2nd stage of FIG. 18, Command Y2 to execute a fine write operation with a 2 bits/cell write scheme is distinguished from Command X3 to execute a fine write operation with a 3 bits/cell write scheme. Otherwise are substantially the same as those illustrated in FIGS. 13 to 16.

Note that when a data read operation is performed, a command is input to order input of an address to read data. Then, address data to be accessed is input, and a command to execute the read operation is input. In this embodiment, inputting Commands P, Q, and R at the beginning of respective read operations, for instance, allows identification and recognition of the page to be accessed. Accordingly, as is the case with a write operation, page data are also included in these commands in a read operation. Of course, for write and read operations of 1 bit/cell, page data are not included in these commands.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
    a memory cell array including an array of electrically rewritable memory cells and configured to be able to store N bits of data (where N is a natural number not less than 2) in one memory cell; and
    a controller operative to control read, write and erase operations of the memory cell array,
    the memory cell array including a first region having a first memory cell operative to retain N bits of data, and a second region having a second memory cell operative to retain M bits of data (where M is a natural number less than N), and
    a data structure of address data received by the controller when accessing the first memory cell being the same as a data structure of address data received from the outside when accessing the second memory cell.

2. The non-volatile semiconductor storage device according to claim 1, wherein
    the controller is operative to be supplied with:
        information identifying a position of a memory cell as the address data; and
        data specifying any of N pages of data, the data being included as a part of a command.

3. The non-volatile semiconductor storage device according to claim 2, wherein
    the address data does not include data specifying any of N pages of data.

4. The non-volatile semiconductor storage device according to claim 1, wherein
    the memory cell array includes an array of NAND cell units, each having the memory cells connected in series, and a block is formed by a plurality of the NAND cell units sharing a word line, the block representing a unit of data erase.

5. The non-volatile semiconductor storage device according to claim 4, wherein
    the controller is operative to be supplied with:
        information identifying a position of a memory cell as the address data; and
        data specifying any of N pages of data, the data being included as a part of a command.

6. The non-volatile semiconductor storage device according to claim 5, wherein
    the address data does not include data specifying any of N pages of data.

7. The non-volatile semiconductor storage device according to claim 4, wherein
    the number of the memory cells in each of the NAND cell units and the number of the memory cells in each of the NAND cell units in which an N bits/cell storage scheme is implemented are determined so that a power-of-two number of bits of data are capable of being stored in the block.

8. The non-volatile semiconductor storage device according to claim 4, wherein
    C represents the number of effective memory cells that are used for data storage in one of the NAND cell units, Pw represents the number of bits of a word-line address to specify a word line connected to the effective memory cells, and a value of Pw is set so that a relation of $2^{(Pw-1)} < C \leq 2^{Pw}$ is held.

9. A non-volatile semiconductor storage device comprising:
    a memory cell array including an array of electrically rewritable memory cells and configured to be able to store N bits of data (where N is a natural number not less than 2) in one memory cell; and
    a controller operative to control read, write and erase operations of the memory cell array,
    the memory cell array including a first region having a first memory cell operative to retain N bits of data, and a second region having a second memory cell operative to retain M bits of data (where M is a natural number less than N), and
    the controller being operative to be supplied with:
        information identifying positions of the memory cells as address data; and
        data specifying any of N pages of data, the data being included as a part of a command.

10. The non-volatile semiconductor storage device according to claim 9, wherein
    the address data does not include data specifying any of N pages of data.

11. The non-volatile semiconductor storage device according to claim 9, wherein
    the memory cell array includes an array of NAND cell units, each having the memory cells connected in series, and a block is formed by a plurality of the NAND cell units sharing a word line, the block representing a unit of data erase.

12. The non-volatile semiconductor storage device according to claim 11, wherein
    the address data does not include data specifying any of N pages of data.

13. The non-volatile semiconductor storage device according to claim 11, wherein
    the number of the memory cells in each of the NAND cell units and the number of the memory cells in each of the NAND cell units in which an N bits/cell storage scheme is implemented are determined so that a power-of-two number of bits of data are capable of being stored in the block.

14. The non-volatile semiconductor storage device according to claim 11, wherein
    C represents the number of effective memory cells that are used for data storage in one of the NAND cell units, Pw represents the number of bits of a word-line address to specify a word line connected to the effective memory cells, and a value of Pw is set so that a relation of $2^{(Pw-1)} < C \leq 2^{Pw}$ is held.

15. A method of writing to a non-volatile semiconductor storage device comprising a memory cell array including an array of electrically rewritable memory cells and configured to be able to store N bits of data (where N is a natural number not less than 2) in one memory cell, the memory cell array including a first region having a first memory cell operative to retain N bits of data, and a second region having a second memory cell operative to retain M bits of data (where M is a natural number less than N), the method comprising:

supplying information identifying positions of the memory cells to the non-volatile semiconductor storage device as address data; and supplying data specifying any of N pages of data to the non-volatile semiconductor storage device, the data being included as a part of a command.

16. The method of writing according to claim 15, wherein the address data does not include data specifying any of N pages of data.

17. The method of writing according to claim 15, wherein the memory cell array includes an array of NAND cell units, each having the memory cells connected in series, and a block is formed by a plurality of the NAND cell units sharing a word line, the block representing a unit of data erase.

18. The method of writing according to claim 17, wherein the address data does not include data specifying any of N pages of data.

19. The method of writing according to claim 17, wherein the number of the memory cells in each of the NAND cell units and the number of the memory cells in each of the NAND cell units in which an N bits/cell storage scheme is implemented are determined so that a power-of-two number of bits of data are capable of being stored in the block.

20. The method of writing according to claim 17, wherein C represents the number of effective memory cells that are used for data storage in one of the NAND cell units, Pw represents the number of bits of a word-line address to specify a word line connected to the effective memory cells, and a value of Pw is set so that a relation of $2^{(Pw-1)} < C \leq 2^{Pw}$ is held.

* * * * *